United States Patent
Wang et al.

(10) Patent No.: US 12,031,861 B2
(45) Date of Patent: Jul. 9, 2024

(54) LIGHT CONVERSION DEVICE WITH HIGH UNIFORMITY

(71) Applicant: Analytik Jena US LLC, Upland, CA (US)

(72) Inventors: Weifeng Wang, Upland, CA (US); Sean Gallagher, Claremont, CA (US); Darius Kelly, Alta Loma, CA (US); Andreas Wolf, Freiburg (DE)

(73) Assignee: Analytik Jena US LLC, Upland, CA (US)

( * ) Notice: Subject to any disclaimer, the term of this patent is extended or adjusted under 35 U.S.C. 154(b) by 0 days.

(21) Appl. No.: 17/582,360

(22) Filed: Jan. 24, 2022

(65) Prior Publication Data

US 2023/0236063 A1    Jul. 27, 2023

(51) Int. Cl.
*G01J 1/08* (2006.01)
*C09K 11/02* (2006.01)
*C09K 11/77* (2006.01)
*G01J 1/04* (2006.01)
*G02B 5/02* (2006.01)

(52) U.S. Cl.
CPC .......... *G01J 1/08* (2013.01); *C09K 11/02* (2013.01); *C09K 11/7721* (2013.01); *C09K 11/77348* (2021.01); *C09K 11/7774* (2013.01); *G01J 1/0474* (2013.01); *G02B 5/0278* (2013.01)

(58) Field of Classification Search
CPC ........... G01J 1/08; G01J 1/0474; C09K 11/02; C09K 11/7721; C09K 11/77348; C09K 11/7774; G02B 5/0278

USPC ............................................... 250/216
See application file for complete search history.

(56) References Cited

U.S. PATENT DOCUMENTS

| | | | |
|---|---|---|---|
| 10,890,705 B2* | 1/2021 | Kim | G02B 6/0035 |
| 10,910,447 B2* | 2/2021 | Chu | G02B 6/005 |
| 2008/0268235 A1 | 10/2008 | Kimura et al. | |
| 2009/0261358 A1 | 10/2009 | Chitnis et al. | |
| 2013/0286630 A1* | 10/2013 | Guiset | F24C 7/083 |
| | | | 362/23.17 |
| 2014/0046083 A1* | 2/2014 | Tilyou | B32B 5/16 |
| | | | 556/19 |
| 2015/0197689 A1 | 7/2015 | Tani et al. | |
| 2017/0113170 A1* | 4/2017 | Kitagawa | B01D 46/0032 |
| 2017/0284611 A1* | 10/2017 | Lin | F21V 5/02 |

(Continued)

FOREIGN PATENT DOCUMENTS

CN    102147488 A    8/2011
CN    211697456 U    10/2020
(Continued)

*Primary Examiner* — Thanh Luu
*Assistant Examiner* — Mai Thi Ngoc Train
(74) *Attorney, Agent, or Firm* — Christopher R. Powers; Endress+Hauser (USA) Holding, Inc.

(57) ABSTRACT

Disclosed is a blue to white light conversion device, comprising: a light conversion subassembly comprising at least one light conversion layer, sandwiched between two light transmitting members, wherein the light conversion layer comprises a light conversion material comprising phosphors and/or quantum dots; at least one light diffusing subassembly neighboring the light conversion subassembly; and a top frame and a bottom frame surrounding the light diffusing subassembly and light conversion subassembly, respectively.

25 Claims, 4 Drawing Sheets

(56) References Cited

U.S. PATENT DOCUMENTS

| | | | |
|---|---|---|---|
| 2019/0025651 A1* | 1/2019 | Sugiyama | G02F 1/133605 |
| 2019/0031956 A1* | 1/2019 | Inata | H01L 33/502 |
| 2019/0137679 A1* | 5/2019 | Kroeger | G02B 6/0065 |
| 2019/0292446 A1* | 9/2019 | Oba | G02F 1/133603 |
| 2021/0184082 A1* | 6/2021 | Stoll | C09K 11/66 |
| 2021/0269709 A1* | 9/2021 | Choi | C09D 175/14 |
| 2021/0364880 A1* | 11/2021 | Tan | G02F 1/133615 |
| 2022/0269092 A1* | 8/2022 | Song | G02B 5/3016 |
| 2022/0402836 A1* | 12/2022 | Joensen | B01J 29/40 |

FOREIGN PATENT DOCUMENTS

| | | |
|---|---|---|
| JP | 4238681 B2 | 3/2009 |
| WO | 2019187462 A1 | 10/2019 |

\* cited by examiner

LIGHT CONVERSION DEVICE WITH HIGH UNIFORMITY

TECHNICAL FIELD

The present invention relates to a light conversion device for an analytic measuring instrument.

BACKGROUND

Recent years have seen the growing use of visible light as an excitation source for the imaging of Sybr Safe, GFP, Coomassie blue, silver stained, and other colorimetric protein gels without the hazards of ultraviolet (UV) light. Because visible light can transmit through all the transparent materials, it is particularly useful for the real-time detection and monitoring of DNA migration and protein expression. In practice, blue and white light are mostly used in laboratories as blue and white light can accommodate a wide spectrum of stained protein gels.

Blue and white light can be generated relatively straightforwardly with either arc bulbs or LEDs (light-emitting diodes). However, high-quality devices equipped with these light sources are relatively complex and expensive. A low-cost and efficient alternative to them is the light conversion plate that can make use of the existing illuminators to produce similar visible light. Specifically, a light conversion plate is a device that absorbs the primary light from an excitation source and then re-emits the absorbed energy at different wavelengths without the consumption of any electric energy. Compared to the traditional light sources, light conversion plates are more durable, easier to handle and less costly for laboratory use.

A conventional commercial light conversion device includes a phosphor layer coated on a transparent or diffusing substrate with another optional transparent plate covering the phosphor layer for the protection from contamination and moisture. A crystal host of phosphor absorbs the excitation photons with specific wavelengths and then transmits the energy to activator ions embedded in the crystal lattice. This energy then excites the electrons inside the activator ions to higher energy states and, upon their relaxation to lower energy states, secondary photons are released at the wavelengths corresponding to the difference of the upper and lower levels.

The phosphor fluorescence process as described above has been successfully applied to commercial UV-white light conversion devices where the phosphor layers are created by the methods of spray, screen printing or electrophoresis. However, such phosphor coating methods have proven to be ineffective for the mass production of the blue-white light converters, for which the white light is produced through the combination of the fluorescent red and green light (e.g., excited by the blue light) as well as partial blue light leaking through the phosphor layer. The final color of the output light therefore is very sensitive to the mass ratio of phosphor and binder matrix, phosphor particle size and the uniformity of phosphor dispersion. For instance, higher concentration of phosphor will block more blue light and thus cause the emission light to be warmer (i.e., lower color temperature). With all these aspects in consideration, it is very difficult to maintain consistent control of the phosphor coating using the above-mentioned methods. As a result, widespread of color variation over the chromaticity chart could be observed from one device to another.

Another issue in conventional light converter configurations is the relatively poor uniformity across the surface. The extent of light output variation can be characterized by a coefficient of variation (CV), which is defined as the ratio of standard deviation and the mean value. A CV level over 20% is common for conventional converters on the market when they are excited with light sources (e.g., transilluminators) that consists of traditional light tubes. That means actual light intensities measured on the surface points of those converters could deviate from the mean intensity by +/−20%, on average. This is understandable since the surface area right above the linear light tube would be significantly brighter than the area in between two light tubes. For LED based transilluminators, the CV is primarily affected by the LED beam angle and the density of LEDs distributed on the substrate plate. It is always a challenge to eliminate or moderate the bright points of LED sources that could be observable from the top of units.

Accordingly, there remains a need for further contributions in this area of technology.

SUMMARY

The object of the present disclosure is a high-performance light conversion device with high conversion efficiency, very consistent color, and superior uniformity.

In one aspect of the present disclosure, a blue to white light conversion device, comprises a light conversion subassembly comprising at least one light conversion layer, sandwiched between two light transmitting members, wherein the light conversion layer comprises a light conversion material comprising phosphors and/or quantum dots, and wherein the light conversion layer is configured to generate a white light from incident blue light; at least one light diffusing subassembly neighboring the light conversion subassembly; and a top frame and a bottom frame surrounding the light diffusing subassembly and light conversion subassembly, respectively.

A high-performance light conversion device with high conversion efficiency is disclosed, having very consistent color and superior uniformity, through the description of exemplary embodiments that use phosphors and quantum dots as the light conversion material.

Regarding the light conversion material, significant progress was made recently to use quantum dots (QD) instead of phosphor. The technology has been applied to some LED displays due to quantum dots' high brightness and boost of color gamut. Quantum dots are semiconductor nanocrystals whose optical properties are essentially determined by the particle sizes. Inside quantum dots, charge carriers are confined in a very small space, e.g., on the scale of a few nanometers where quantum mechanics dominates their behaviors. The result of this quantum confinement effect is that charge carriers are only allowed to occupy a set of discrete energy levels in a similar manner of electrons in atoms. Light conversion thus can be realized through the transitions among these discrete energy levels by absorbing incident light at specific wavelengths and then emitting the incident energy at a different wavelength range.

In optional variations, one or more of the following features can be included.

In an interrelated aspect, the phosphors comprise yellow, green, or red phosphors.

In an interrelated aspect, the phosphors include one or more of cerium-doped yttrium aluminum garnet (YAG:Ce) phosphors, europium-doped phosphors, ytterbium-doped phosphors, gadolinium-doped phosphors, aluminate phosphors, and nitride phosphors.

In an interrelated aspect, the quantum dots include cadmium selenide, cadmium selenide/cadmium sulfide, cadmium selenide/zinc sulfide, cadmium sulfide, cadmium telluride, carbon, CdSeTe/ZnS, graphene, indium phosphide/zinc sulfide, lead selenide, lead sulfide quantum dots, magnesium-doped zinc oxide, manganese-doped zinc oxide, manganese-doped zinc selenide, perovskite, zinc cadmium selenide/zinc sulfide, zinc oxide, zinc selenide/zinc sulfide, ZnCdSeS, ZnCuInS/ZnS and the combinations thereof.

In an interrelated aspect, the phosphor is a ceramic phosphor.

In an interrelated aspect, the light conversion layer comprises a light conversion material embedded into a binder matrix.

In an interrelated aspect, the binder matrix comprises organic material.

In an interrelated aspect, the organic material comprises epoxy, silicone, acrylic, alkyd, phenolic, polyamide, polycarbonate polyester, polyethylene, polyethylene terephthalate, polypropylene, polystyrene, polyurethane, polyvinyl chloride, natural or synthetic resins.

In an interrelated aspect, the binder matrix comprises inorganic material.

In an interrelated aspect, the inorganic material comprises bulk ceramics, glass phosphor or single crystal phosphor for phosphors being the light conversion material.

In an interrelated aspect, the inorganic material comprises glass with a melting point in the range of 300-500° C.

In an interrelated aspect, the glass comprises lithium, sodium, potassium, calcium, iron, copper, vanadium, neodymium, titanium dioxide ($TiO_2$) or silver.

In an interrelated aspect, the light conversion material has a concentration of 40-80 weight % in the binder matrix.

In an interrelated aspect, the light transmitting member comprises glass, quartz, or plastics.

In an interrelated aspect, the plastics comprises or is coated with polyethylene terephthalate (PET), polyvinyl chloride (PVC), polypropylene (PP), polystyrene (PS), polycarbonate (PC), polymethyl methacrylate (PMMA), polyamide, obscure glass, Teflon® (PTFE or PTFE/FEP), acrylonitrile butadiene styrene (ABS), styrene acrylonitrile (SAN), polyethylene, or thermoplastic polyurethane (TPU).

In an interrelated aspect, the light transmitting member is textured (e.g., frosted) by sandblasting or acid etching.

In an interrelated aspect, the light diffusing subassembly comprises a diffuser sheet sandwiched between transparent or translucent sheets.

In an interrelated aspect, the transparent or translucent sheets comprises glass, quartz, or one or more plastic polymers.

In an interrelated aspect, the plastics comprises or is coated with polyethylene terephthalate (PET), polyvinyl chloride (PVC), polypropylene (PP), polystyrene (PS), polycarbonate (PC), polymethyl methacrylate (PMMA), polyamide, obscure glass, Teflon® (PTFE or PTFE/FEP), acrylonitrile butadiene styrene (ABS), styrene acrylonitrile (SAN), polyethylene, or thermoplastic polyurethane (TPU).

In an interrelated aspect, the light conversion and the light diffusing subassembly are spaced apart by at least one spacer.

In an interrelated aspect, the light conversion and the light diffusing subassembly are spaced apart from each other by 1-3 cm by a spacer.

In an interrelated aspect, the light conversion device comprises a stack of multiple light diffusing subassemblies, each light diffusing subassembly separated by the neighboring one by a spacer.

In an interrelated aspect, the top frame and a bottom frame have rectangular shape in the dimensions 150-320 mm by 150-320 mm with an opening of 130-300 mm by 130-300 mm.

In another aspect, a measurement device is disclosed, the device comprising at least one light source emitting blue light; a light conversion device as described above to convert the blue light from the light source into white light; a sample holder configured to retain the sample such that the white light is directed into and at least partially through the sample.

The details of one or more embodiments of the subject matter described herein are set forth in the accompanying drawings and the description below. Other features and advantages of the subject matter described herein will be apparent from the description and drawings and from the claims.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

One aspect of the present disclosure is to convert blue light to white light using phosphor mixtures. The present disclosure includes a large sheet converter for one or more light sources, e.g., LEDs. Based on a blue light table (e.g., 15 cm×20 cm), light is converted to a white light on a table of the same dimensions with the placement of one or more converter plates with an internal (e.g., 15 cm×20 cm) layer of conversion phosphor. Both blue light and white light are used frequently for imaging analysis of protein, DNA separations by technique called electrophoresis. Blue light is considered safer for many biological molecules and materials. Electrophoresis separates such biological molecules in sheets of acrylamide that range from, e.g., 10 cm×10 cm to 15 cm×20 cm typically. Blue light is used as an excitation light for certain dyes that detect DNA and protein. However, other known stains for proteins are simply absorption dyes, which stain the proteins blue, and are visualized on a white light table. Thus, instead of removing and replacing the blue light table with an all-white light table for different samples, the present disclosure includes inserting a light-uniform sheet of conversion material that converts the blue light to the white light. In certain embodiments, instead of phosphor materials, quantum dots can be used with the same result.

Figure 1:
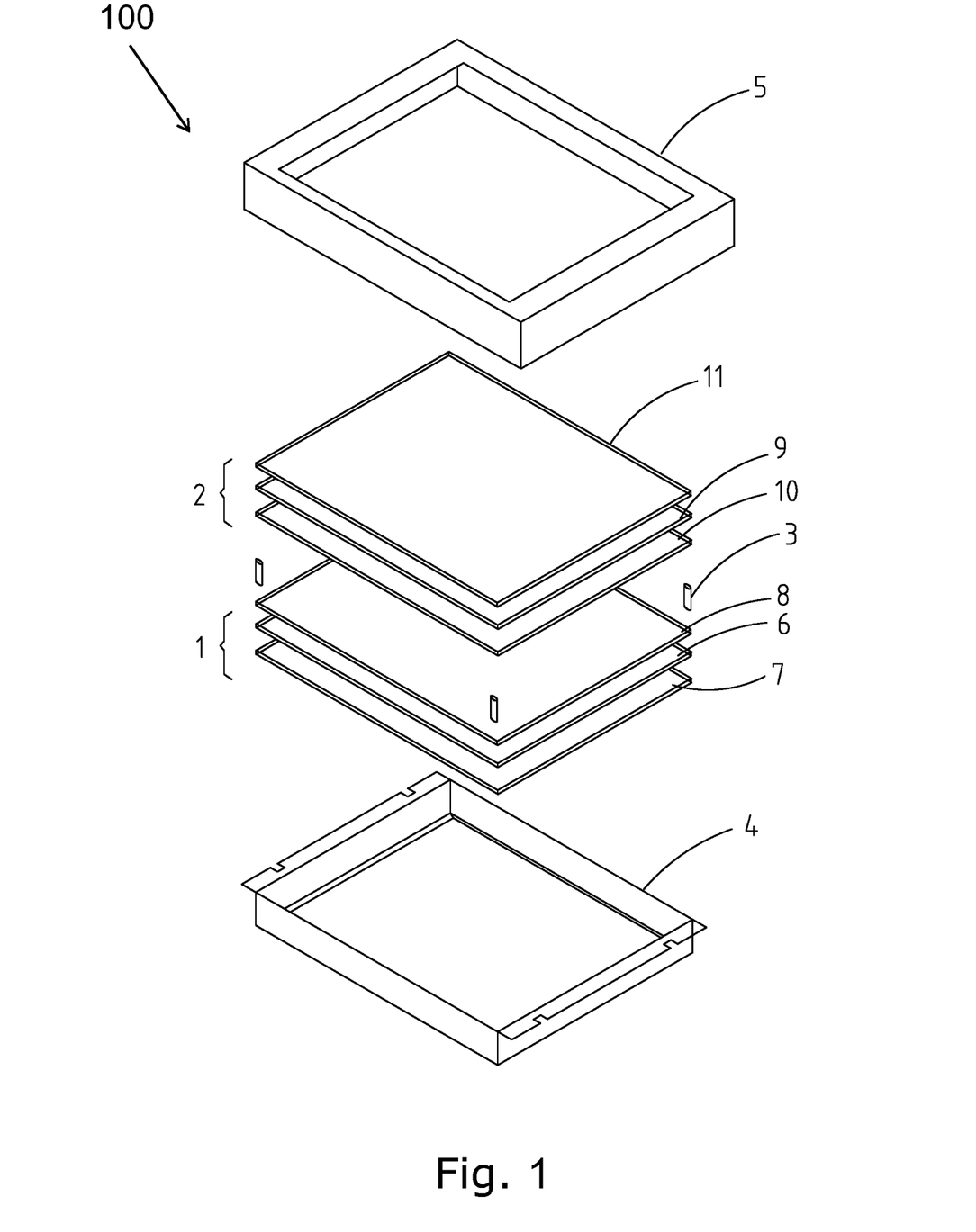
FIG. 1 shows an exploded, perspective view an embodiment of the light conversion device of the present disclosure.

In an embodiment as shown in FIG. 1, a high-performance blue-to-white light conversion device 100 includes a light conversion subassembly 1, a diffusing subassembly 2, spacers 3, a bottom frame 4 and a top frame 5.

The light conversion subassembly 1 may include a light conversion layer 6 sandwiched between two light-transmitting members 7, 8. In the present disclosure, the light conversion layer 6 may include phosphors or quantum dots or the mixture of phosphors and quantum dots dispersed in a binder matrix and then cured with heat and/or UV to form a film.

Types of the binder matrices of the light conversion layer 6 may include organic materials, like, as non-limiting examples, resin and epoxy such as silicone, acrylic, alkyd, phenolic, polyamide, polycarbonate polyester, polyethylene, polyethylene terephthalate, polypropylene, polystyrene, polyurethane, polyvinyl chloride, or natural and/or synthetic resins, and any other suitable substrate material in which phosphors or quantum dots can be dispersed.

As alternatives to such phosphor-binder matrices, inorganic light conversion materials such as bulk ceramic phosphors, glass phosphors and single crystal phosphors can be used, instead of a resin-based phosphor, to improve the thermal and chemical stability and the light conversion efficiency. While the chemical composition of ceramic phosphors is generally close to their counterpart powders (e.g., in the nano- or micro-size range) used in conventional phosphor-in-resin matrices, a significant distinction is that ceramic phosphor is made into a single, unified and massive polycrystalline structure through sintering. By avoiding the use of a resin (e.g., an adhesive resin), inorganic base materials have demonstrated their effectiveness as a homogenous luminescent substrate or an optical converter in the form of a plate. Moreover, the manufacturing of inorganic phosphors is relatively simple. For example, glass phosphor can be manufactured by sintering the phosphors and glass powder into a plate with temperature less than 800° C. Similar sintering processes can be applied to quantum dots mixed with glass when a glass with low melting point (300-500° C.) is used. To lower the glass melting point, chemical modifiers such as lithium, sodium, potassium, calcium, iron, copper, vanadium, neodymium, titanium dioxide ($TiO_2$) and silver can be added into regular glass to reduce the number of strong bonds therein.

In certain embodiments, phosphors and quantum dots are blended and then dispersed into the organic or inorganic base material to improve the light conversion efficiency and the color richness of the secondary light, which is the output from the converter. Because quantum dots are generally capped with a hydrophobic ligand, such quantum dots do not agglomerate with phosphor particles.

The thickness of the phosphor or quantum dot films may be limited. Although luminous flux increases with more light-converting phosphor particles or quantum dots, losses due to scattering will also become greater. In embodiment of the present disclosure, film thicknesses ranging from 50 μm to 1 mm yield sufficiently high luminescence efficiency. Based on the same consideration, the phosphor particle size is preferably in range of 5-50 μm. However, the sizes of quantum dots cannot be tuned substantially since the wavelengths of the absorbed and emitted lights are primarily determined by the dimensions of quantum dots. For instance, to obtain red and yellow colors (e.g., which may be combined with blue to produce white), relatively large quantum dots, e.g., having a diameter of 5-6 nm, may be used. For shorter wavelengths such as blue and green, smaller quantum dots, e.g., with diameter of 2-3 nm, may be preferred. In the present disclosure, the size of the quantum dots varies from 1-10 nm. Red and yellow quantum dots or phosphors are physically blended as to convert blue light to red and yellow, which produce white when combined with some blue light passing through the conversion layer.

Further, depending on the desired color temperature (e.g., 3000-6000 K), Applicant has found a concentration of 40-80% phosphor to the film (by weight) was suitable for the present embodiments. The same concentration range also worked well for quantum dots. However, too high a concentration of the light conversion substance tended to cause agglomeration of particles and a less uniform distribution of phosphors in the film.

To convert typical LED blue light (e.g., 440-470 nm) to white light, yellow, green and/or red phosphors with efficient absorption of blue light (e.g., 420-480 nm) are used. Examples of such phosphors include one or more of Ce-doped YAG (YAG:Ce) phosphors, Eu-doped phosphors, Yb-doped phosphors, Gd-doped phosphors, aluminate phosphors, nitride phosphors, and silicates.

Similarly, quantum dots are selected from various well-known semiconductor nanocrystals, including but not limited to: cadmium selenide; cadmium selenide/cadmium sulfide; cadmium selenide/zinc sulfide, cadmium sulfide, cadmium telluride, carbon, CdSeTe/ZnS, graphene, indium phosphide/zinc sulfide, lead selenide, lead sulfide quantum dots, magnesium-doped zinc oxide, manganese-doped zinc oxide, manganese-doped zinc selenide, perovskite, zinc cadmium selenide/zinc sulfide, zinc oxide, zinc selenide/zinc sulfide, ZnCdSeS, ZnCuInS/ZnS, and combinations of thereof.

The planar light-transmitting members 7, 8 as shown in FIG. 1 are adapted to provide protection from contamination for the light conversion layer 6. The light-transmitting members 7, 8 may be made of glass, quartz or a plastic polymer such as polyethylene terephthalate (PET), polyvinyl chloride (PVC), polypropylene (PP), polystyrene (PS), polycarbonate (PC), polymethyl methacrylate (PMMA), polyamide (PA), acrylonitrile butadiene styrene (ABS), styrene acrylonitrile (SAN), polyethylene (PE), thermoplastic polyurethane (TPU) or other suitable plastic. At least one side of the light-transmitting members 7, 8 may be textured, e.g., frosted by sandblasting or acid etching, to create a diffuse or translucent effect that may facilitate or enhance the uniformity of the converted, outgoing light. In at least one embodiment, either or both of the entire light-transmitting members 7, 8 may be made with an obscure material such as obscure glass, polytetrafluoroethylene (PTFE), fluorinated ethylene propylene (FEP) and copolymers thereof (e.g., PTFE/FEP). Yet in another embodiment, one or more surfaces of the light-transmitting members 7, 8 are coated with PTFE to provide the same diffusing effect.

To achieve super high uniformity for image analysis and quantitation, a separate light diffusing subassembly 2 may be positioned above the light conversion subassembly 1. As shown in FIG. 1, a gap is created between subassembly 1 and subassembly 2 to further increase the degree of diffuse. In at least one embodiment, spacers 3, e.g., positioned at the corners of the device as shown in FIG. 1 to prevent shadows, may be introduced to set the gap at a specific distance. Because of the divergence of a light beam, a larger gap distance means more diffusion and thus higher uniformity. Nonetheless, spacing of subassembly 1 and subassembly 2 still must be limited, as an excessive gap distance could make the device too tall to fit in an imaging system, into which the light conversion device 100 may be incorporated, and/or cause the imaging of samples, placed above the converter, to be out of the focal range of the imaging systems camera. As such, spacers 3 with heights in the range of 10-30 mm may be in embodiments of the present disclosure.

In the light diffusing subassembly 2, at least one diffuser sheet 9 is disposed between two transparent or translucent members 10, 11. The diffuser sheet 9 may be a high-performance diffuser sheet engineered to diffuse light without notable attenuation of light transmission. In embodiments of the present disclosure, the diffuser sheet 9 may be made of special grade acrylic sheet, polycarbonate sheet, or polycarbonate film by extrusion or injection molding processes, with at least one surface microstructured or textured to effectively hide bright spots of the light source and smooth the light distribution. For example, C-series diffusers from Bright View Technologies, Inc. (4022 Durham, NC 27703, USA) were procured and tested. CV values smaller than 5% were obtained because of their excellent depixellation. Like members 7,8 of the light conversion subassembly 2, members 10, 11 may be adapted to protect the diffuser sheet 9 and, in certain embodiments, to improve diffusion. Accordingly, members 10, 11 can be made of the same materials and optionally formed with similar surface patterns as described herein with respect to the members 7, 8.

Light extraction efficiency may be negatively affected by reflection at the interface of two different materials due to the change of optical refractive index. In at least one embodiment of the present disclosure, a plurality of protrusion patterns thus can be formed on one or multiple surfaces of the members 7, 8, 10, 11 using any suitable method (the method of etching, for example) to create a more gradual transition of the refractive index at the interfaces.

In at least one embodiment of the present disclosure, a single diffusing plate, e.g., made of acrylic, polycarbonate, obscure glass, PTFE or PTFE/FEP, can be used in substitution for the three-member diffusing subassembly 2. Examples of such sheets include OPTIX® LD, OPTIX® 95, OPTIX® 95 LED, OPTIX® Frost LED, OPTIX® Lum 1, OPTIX® Flex G2, OPTIX® Flexilume, OPTIX® LED Satin, OPTIX® Pattern 12 (PL-21), KSH® panels, Plexiglas® Sylk, or Teflon® that provide superior diffusion properties. Further, one or both sides of the plate may be treated or textured, e.g., frosted, or acid etched, to improve diffusing efficiency.

In case of very low uniformity from the light source (e.g., transilluminator), multiple diffusing subassemblies may be placed above the light conversion subassembly 2, with each subassembly set apart from its neighboring one at a distance, in a similar way as described above.

The light conversion subassembly 1 and the diffusing subassembly 2 may be first installed on the holding frame 4 and then covered with the top frame 5. Both frames can be made of steel, aluminum, other metals and alloys or plastics. In at least one embodiment, the top frame measures 240×184 mm with a central opening of 202×160 mm defined within the frame. In another embodiment, the top frame measures 290×266 mm with a central opening of 252×242 mm defined within the frame.

Figure 2A:
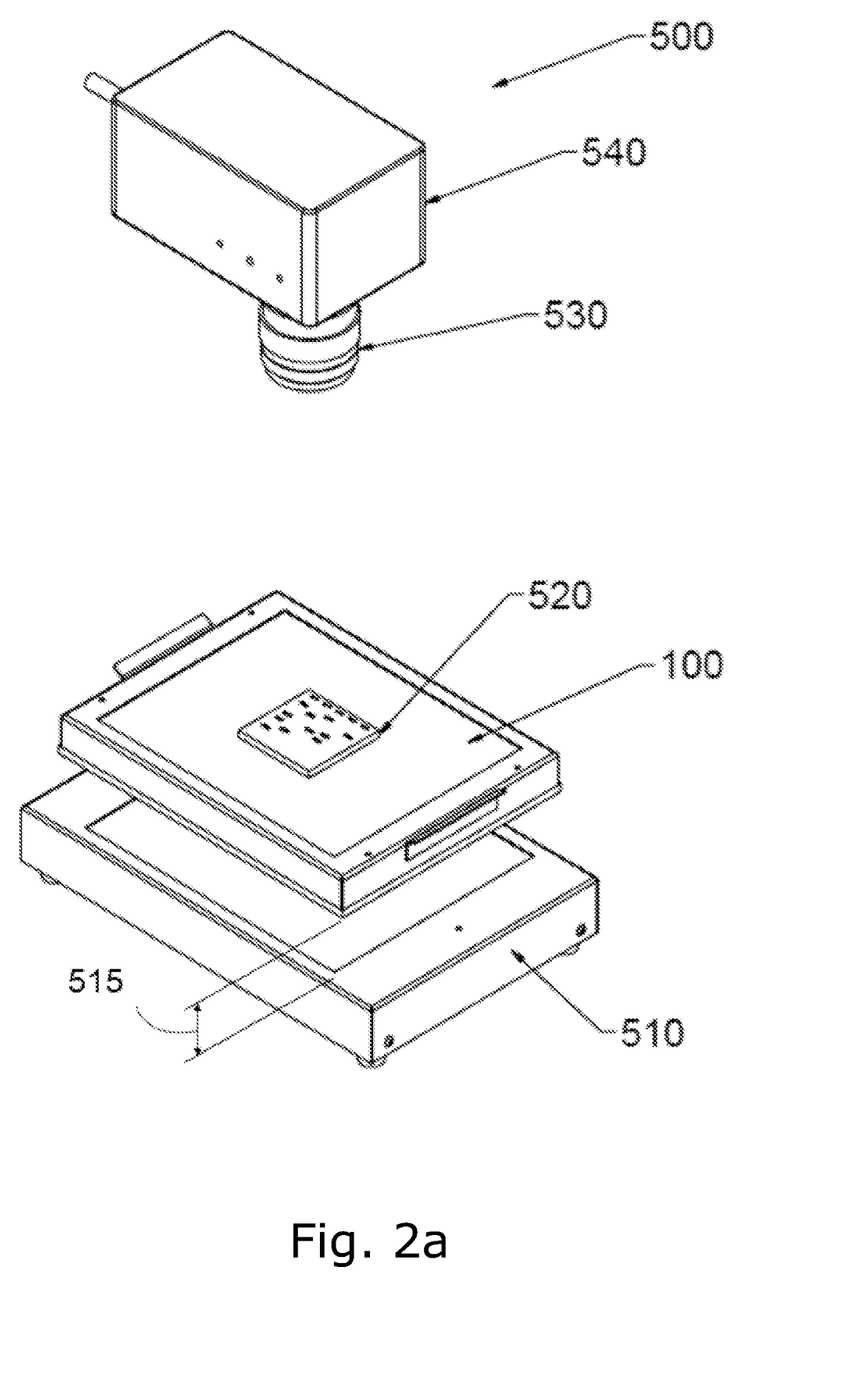
FIGS. 2a and 2b show perspective views of embodiments of measurement devices including a light conversion device of the present disclosure.

FIG. 2a shows the blue to white light conversion device 100 in a device 500 built to image DNA gels, protein gels, blue/white gels, plants, colorimetrics, and colony plates. The device 500 can also be used for imaging chemiluminescent western blots, fluorescent western blots and NIR. The device 500 enables a wide scope of fluorescent and nonfluorescent imaging applications. The device 500 can be upgraded with various lighting options and accessories for expanded application capabilities. The device 500 can be available as a computer-controlled version for laboratories with specific computers.

Figure 2B:
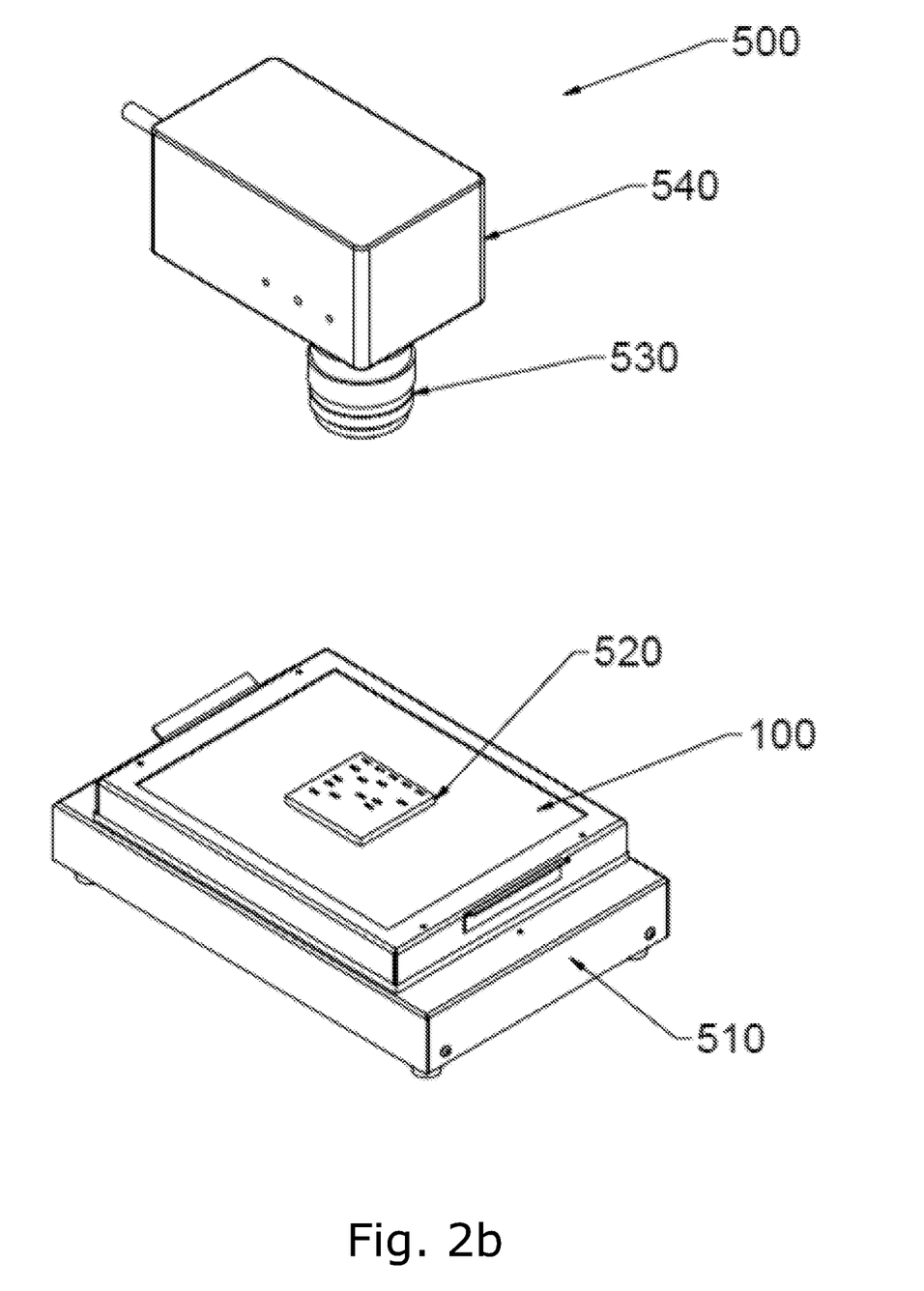

FIG. 2a shows the conversion device 100 separated from a light source 510 by a distance 515. FIG. 2b shows the conversion device directly on top of (e.g., adjacent) the light source 510 such that the top and/or bottom frame of the conversion device 100 contacts the light source 510, including a frame or support of the light source 510.

The device 500 comprises the light source 510, e.g., a 302 nm light source or a 460-470 nm light source, in general a blue light source. After being converted by the blue to white light conversion device 100, the light passes through the sample 520 and is collected by optical elements 530. The optical elements 530 comprise one or more lenses, filters, apertures, mirrors, or other optical elements. For example, shown in FIGS. 2a and 2b is a lens subassembly. In embodiments, light is captured with a wide aperture, f/1.2 lens, for example, where the exposure times are reduced, allowing quicker speeds for image capture.

The light from the sample 520 is received by a camera 540, in general a light detector. The camera 540 can be an 8 MP of 12 MP high performance imaging camera, but is chosen depending on the application, the application requiring maximum light sensitivity, a wider dynamic range, or supreme quantum efficiency. The camera 540 may utilize a wide aperture. The camera 540 can be deeply cooled to deliver clean images with no noise and a low background.

Figure 3:
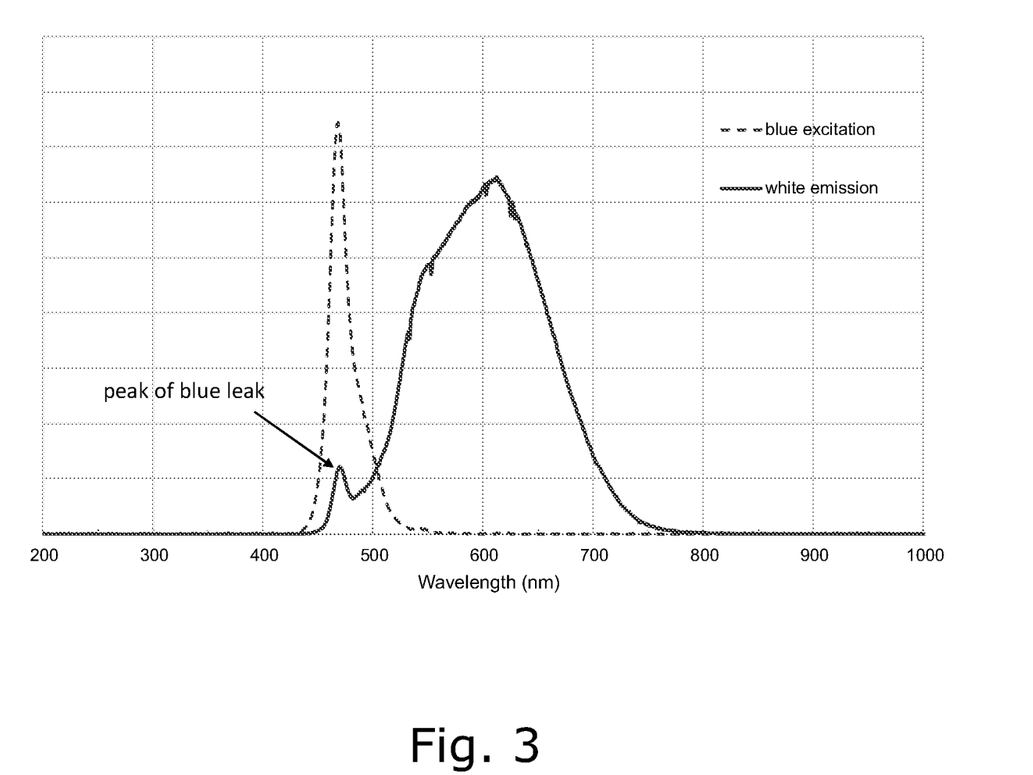
FIG. 3 shows spectra before and after the light conversion with a light conversion device of the present disclosure.

Referring to FIG. 3, the primary blue light incident on the converter device excites the phosphors and/or quantum dots inside the conversion layer and then is converted to the secondary red and yellow light, which are in turn combined with the leaked blue light to produce the final white light as desired. FIG. 3 shows a spectrum of the light source's blue light and the corresponding white light for the sample.

Table 1 contains a non-limiting list of exemplary phosphors with wavelength ranges:

TABLE 1

Phosphor Examples

| Excitation Peak | Emission Peak | Phosphor | Binder |
| --- | --- | --- | --- |
| 450-460 nm | 530-550 nm | $Y_3Al_5O_{12}:Ce^{3+}$ | Silicone, Polyurethane, |
| 450-475 nm | 550-570 nm | $(Y,Gd)_3Al_5O_{12}:Ce^{3+}$ | Methyl methacrylate |
| 465-475 nm | 575-595 nm | $Gd_3Al_5O_{12}:Ce^{3+}$ | (PMMA), Glass |
| 440-470 nm | 520-540 nm | $Y_3(GaAl)_5O_{12}:Ce^{3+}$ | |
| 440-450 nm | 520-550 nm | $Lu_3Al_5O_{12}:Ce^{3+}$ | |
| 445-465 nm | 610-650 nm | $CaAlSiN_3:Eu^{2+}$ | |

Table 2 contains a non-limiting list of exemplary quantum dot with wavelength ranges:

TABLE 2

Quantum Dot Examples

| Excitation Peak | Emission Peak | Quantum Dot | Binder |
| --- | --- | --- | --- |
| 350-650 nm | 450-670 nm | CdSe | Polyester acrylate, |
| 350-730 nm | 500-750 nm | CdTe | Polyurethane acrylate, |
| 350-630 nm | 530-650 nm | InP/ZnS | Epoxy acrylate, Silicone |
| 350-640 nm | 515-660 nm | CdSe/CdS | |

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The implementations set forth in the foregoing description do not represent all implementations consistent with the subject matter described herein. Instead, they are merely some examples consistent with aspects related to the described subject matter. Although a few variations have been described in detail herein, other modifications or additions are possible. In particular, further features and/or variations can be provided in addition to those set forth herein. For example, the implementations described above can be directed to various combinations and sub-combinations of the disclosed features and/or combinations and sub-combinations of one or more features further to those disclosed herein. In addition, the logic flows depicted in the accompanying figures and/or described herein do not necessarily require the particular order shown, or sequential order, to achieve desirable results. The scope of the following claims may include other implementations or embodiments.

Claimed is:

1. A measurement device, comprising:
   at least one light source configured to emit blue light;
   a light conversion device arranged such that the blue light emitted by the at least one light source is incident upon the light conversion device, which is configured to convert the blue light from the at least one light source into white light, the light conversion device comprising:
      a light conversion subassembly comprising at least one light conversion layer disposed between two light transmitting members, wherein the light conversion layer comprises a light conversion material comprising phosphors and/or quantum dots, and wherein the light conversion layer is configured to generate the white light from the incident blue light;
      at least one light diffusing subassembly adjacent the light conversion subassembly; and
      a top frame and a bottom frame at least bordering the at least one light diffusing subassembly and the light conversion subassembly, respectively;
   a sample holder configured to retain a sample such that the white light is directed into and at least partially through the sample; and
   a light detector configured to receive light that passes through the sample.

2. The measurement device of claim 1, wherein the light conversion material comprises phosphors, which comprise yellow, green, or red phosphors.

3. The measurement device of claim 2, wherein the phosphors include one or more of Ce-doped YAG (YAG:Ce) phosphors, Eu-doped phosphors, Yb-doped phosphors, Gd-doped phosphors, aluminate phosphors, and nitride phosphors.

4. The measurement device of claim 1, wherein the light conversion material comprises quantum dots, which comprise nanocrystals of at least one of cadmium selenide, cadmium selenide/cadmium sulfide, cadmium selenide/zinc sulfide, cadmium sulfide, cadmium telluride, carbon, cadmium selenide telluride (CdSeTe/ZnS), graphene, indium phosphide/zinc sulfide, lead selenide, lead sulfide, magnesium-doped zinc oxide, manganese-doped zinc oxide, manganese-doped zinc selenide, perovskite, zinc cadmium selenide/zinc sulfide, zinc oxide, zinc selenide/zinc sulfide, zinc cadmium selenide sulfide (ZnCdSeS), zinc copper indium sulfide/zinc sulfide (ZnCuInS/ZnS).

5. The measurement device of claim 1, wherein the phosphor is a ceramic phosphor.

6. The measurement device of claim 1, wherein the light conversion layer comprises the light conversion material embedded into a binder matrix.

7. The measurement device of claim 6, wherein the binder matrix comprises organic material.

8. The measurement device of claim 7, wherein the organic material comprises epoxy, silicone, acrylic, alkyd, phenolic, polyamide, polycarbonate polyester, polyethylene, polyethylene terephthalate, polypropylene, polystyrene, polyurethane, polyvinyl chloride, or natural and/or synthetic resins.

9. The measurement device of claim 6, wherein the binder matrix comprises inorganic material.

10. The measurement device of claim 9, wherein the light conversion material comprises phosphors, and wherein the inorganic material comprises bulk ceramics, glass phosphor, or single-crystal phosphor.

11. The measurement device of claim 9, wherein the inorganic material comprises glass with a melting point in the range of 300-500° C.

12. The measurement device of claim 11, wherein the glass comprises at least one of lithium, sodium, potassium, calcium, iron, copper, vanadium, neodymium, titanium dioxide, and silver.

13. The measurement device of claim 6, wherein the light conversion material has a concentration of 40-80% by weight in the binder matrix.

14. The measurement device of claim 1, wherein the light transmitting-members comprise glass, quartz, or plastic.

15. The measurement device of claim 14, wherein the light transmitting members comprise plastic, which plastic comprises or is coated with polyethylene terephthalate (PET), polyvinyl chloride (PVC), polypropylene (PP), polystyrene (PS), polycarbonate (PC), polymethyl methacrylate (PMMA), polyamide, obscure glass, acrylonitrile butadiene styrene (ABS), styrene acrylonitrile (SAN), polyethylene (PE), thermoplastic polyurethane (TPU), polytetrafluoroethylene (PTFE), fluorinated ethylene propylene (FEP), or copolymers of polytetrafluoroethylene and fluorinated ethylene propylene (PTFE/FEP).

16. The measurement device of claim 1, wherein at least one of the light transmitting members is textured.

17. The measurement device of claim 1, wherein the at least one light diffusing subassembly comprises a diffuser sheet disposed between transparent or translucent sheets.

18. The measurement device of claim 17, wherein the transparent or translucent sheets comprise glass, quartz, or plastic.

19. The measurement device of claim 18, wherein the transparent or translucent sheets comprise plastic, which plastic comprises or is coated with polyethylene terephthalate (PET), polyvinyl chloride (PVC), polyamide, obscure glass, acrylonitrile butadiene styrene (ABS), styrene acrylonitrile (SAN), polyethylene (PE), thermoplastic polyurethane (TPU), polytetrafluoroethylene (PTFE), fluorinated ethylene propylene (FEP), or copolymers of polytetrafluoroethylene and fluorinated ethylene propylene (PTFE/FEP).

20. The measurement device of claim 1, further comprising a stack of multiple light diffusing subassemblies, each light diffusing subassembly separated from an adjacent light diffusing subassembly by at least one additional spacer.

21. The measurement device of claim 1, wherein the top frame and a bottom frame are each rectangular in shape with dimensions of 150-320 mm by 150-320 mm, each defining a central opening of 130-300 mm by 130-300 mm.

22. The measurement device of claim 1, wherein the light conversion subassembly is substantially rectangular in shape, and the two or more spacers are each disposed at or near corners of the light conversion subassembly and configured as to prevent shadows on the at least one light diffusing subassembly.

23. The measurement device of claim 1, wherein the specified distance of the gap is 10-30 mm.

24. The measurement device of claim 1, further comprising two or more spacers, each disposed at or near a perimeter of the light conversion subassembly as to define a gap of a specified distance between the at least one light diffusing subassembly and the light conversion subassembly.

25. The measurement device of claim 1, wherein the specified distance of the gap is fixed.

* * * * *